United States Patent
Iwasa et al.

(10) Patent No.: US 8,564,292 B2
(45) Date of Patent: Oct. 22, 2013

(54) MAGNETIC RESONANCE IMAGING APPARATUS AND GRADIENT COIL COOLING CONTROL METHOD

(71) Applicants: Kabushiki Kaisha Toshiba, Tokyo (JP); Toshiba Medical Systems Corporation, Otawara (JP)

(72) Inventors: Masateru Iwasa, Otawara (JP); Kazuto Nogami, Tochigi-Ken (JP); Tomoyuki Yoshida, Tochigi-Ken (JP); Fumitoshi Kojima, Otawara (JP); Yoshitomo Sakakura, Tochigi-Ken (JP); Kohei Adachi, Tochigi-Ken (JP)

(73) Assignees: Kabushiki Kaisha Toshiba, Tokyo (JP); Toshiba Medical Systems Corporation, Tochigi-Ken (JP)

( * ) Notice: Subject to any disclaimer, the term of this patent is extended or adjusted under 35 U.S.C. 154(b) by 0 days.

(21) Appl. No.: 13/645,239

(22) Filed: Oct. 4, 2012

(65) Prior Publication Data
US 2013/0038328 A1    Feb. 14, 2013

Related U.S. Application Data

(63) Continuation of application No. 12/567,461, filed on Sep. 25, 2009, now Pat. No. 8,305,079.

(30) Foreign Application Priority Data

Oct. 3, 2008    (JP) ................................ 2008-258903
Aug. 10, 2009   (JP) ................................ 2009-186045

(51) Int. Cl.
*G01V 3/00*  (2006.01)

(52) U.S. Cl.
USPC ............................................ 324/315; 324/318

(58) Field of Classification Search
USPC .................................... 324/315, 318, 322
See application file for complete search history.

(56) References Cited

U.S. PATENT DOCUMENTS

| | | | |
|---|---|---|---|
| 6,977,501 B2 | 12/2005 | Kassai et al. |
| 6,992,483 B1 | 1/2006 | Emeric et al. |
| 7,301,343 B1 | 11/2007 | Sellers |
| 7,304,477 B2 | 12/2007 | Konijn et al. |
| 7,309,987 B2 | 12/2007 | Lukens et al. |
| 7,706,856 B2 | 4/2010 | Dean et al. |

(Continued)

FOREIGN PATENT DOCUMENTS

| | | |
|---|---|---|
| JP | 2002-159465 A | 6/2002 |
| JP | 2005-270327 A | 10/2005 |

(Continued)

OTHER PUBLICATIONS

Japanese Office Action with English Translation for Japanese Patent Application No. 2009-186045 mailed on Aug. 27, 2013.

*Primary Examiner* — Louis Arana
(74) *Attorney, Agent, or Firm* — Yoshida & Associates, LLC

(57) ABSTRACT

A feedforward control unit predicts the maximum value of the temperature of a gradient coil based on a power duty and a scan time of a pulse sequence, and a present temperature of the gradient coil. When the maximum value exceeds a predetermined upper limit, the feedforward control unit then instructs a temperature adjusting unit to start a water circulation in a chiller at the start of a prescan, and the temperature adjusting unit starts the water circulation based on the instruction.

21 Claims, 5 Drawing Sheets

(56) References Cited

U.S. PATENT DOCUMENTS 7,868,617 B2  1/2011  Seeber et al.
8,058,873 B2  11/2011  Timinger
8,305,079 B2 *  11/2012  Iwasa et al. .................. 324/315

FOREIGN PATENT DOCUMENTS

| | | |
|---|---|---|
| JP | 2006-311957 A | 11/2006 |
| JP | 2007-512073 A | 5/2007 |
| JP | 2008-228765 A | 10/2008 |

* cited by examiner

→ : FLOW OF WATER
---→ : FLOW OF SIGNAL

MAGNETIC RESONANCE IMAGING APPARATUS AND GRADIENT COIL COOLING CONTROL METHOD

CROSS-REFERENCE TO RELATED APPLICATIONS

This application is based upon and claims the benefit of priority from the prior Japanese Patent Application No. 2008-258903, filed on Oct. 3, 2008, and No. 2009-186045, filed on Aug. 10, 2009; the entire contents of which are incorporated herein by reference.

BACKGROUND OF THE INVENTION

1. Field of the Invention

The present invention relates to a technology for cooling a gradient coil of a magnetic resonance imaging apparatus.

2. Description of the Related Art

A Magnetic Resonance Imaging apparatus (hereinafter, "MRI apparatus") is an apparatus that takes an image of the inside of a subject by using a magnetic resonance phenomenon, and includes various units for performing a scan, such as a static magnetic-field magnet that generates a static magnetic field in a scan region, a gradient coil that applies a gradient magnetic field onto the subject placed in the static magnetic field, and a Radio Frequency (RF) coil that receives a magnetic resonance signal from the subject applied with the RF field.

Some of such units generate heat during a scan. Particularly, the gradient coil markedly generates heats during a scan because a pulse current is repeatedly supplied in accordance with a pulse sequence (a series of time charts that indicates ON/OFF and the amplitude of an RF pulse and a gradient magnetic-field pulse). For this reason, the MRI apparatus usually includes a chiller for cooling the gradient coil. The chiller includes, for example, a heat exchanger and a circulation pump, and cools the gradient coil by circulating a coolant, such as water, through a cooling pipe provided to the gradient coil (for example, see JP-A 2006-311957 (KOKAI).

The gradient coil is sometimes provided with an iron shim for correcting ununiformity of a static magnetic field inside a scan region in some cases; and when the temperature of the gradient coil varies, magnetic permeability of the iron shim changes due to the influence of a variation in the temperature. When the magnetic permeability of the iron shim changes, a change appears in the uniformity of the static magnetic field in the scan region, and particularly a change in a center frequency (f0) is considerable.

It is known that a fluctuation in the center frequency (f0) can be an obstacle to fat suppression or a cause of an artifact in an image. Therefore, to obtain an image of stable quality, it is required to suppress variations in the temperature of the iron shim. As shown in FIG. 8, an MRI apparatus usually suppresses variations in the temperature of a gradient coil 20 by detecting a temperature T of the gradient coil 20 by using, for example, a temperature sensor, and controlling a chiller 400 by feedback control in accordance with a change in the detected temperature T.

However, a delay in control arises in cooling by the feedback control, consequently a range of temperature variations of the iron shim is extended, resulting in great fluctuations in the center frequency (f0). For such reasons, it is required to reduce the range of temperature variations of the iron shim caused by a delay in control.

SUMMARY OF THE INVENTION

According to one aspect of the present invention, a magnetic resonance imaging apparatus includes a gradient coil that applies a gradient magnetic field onto a subject placed in a static magnetic field; a chiller that cools the gradient coil; and a control unit that controls the chiller, wherein the gradient coil includes a main coil that generates the gradient magnetic field, and a shield coil that cancels a magnetic field leaking to an outside of the main coil, and the control unit controls the chiller based on a power duty of a current to be supplied to the main coil and the shield coil, the power duty being determined from scanning parameters of a pulse sequence to be used for a scan of the subject.

According to another aspect of the present invention, a magnetic resonance imaging apparatus includes a gradient coil that applies a gradient magnetic field onto a subject placed in a static magnetic field; a chiller that cools the gradient coil; and a control unit that controls the chiller, wherein the control unit controls the chiller based on an amount of change in a center frequency (f0) of magnetic resonance.

According to still another aspect of the present invention, a gradient coil cooling control method includes acquiring a power duty of a current to be supplied to a main coil and a shield coil included in a gradient coil that applies a gradient magnetic field onto a subject placed in a static magnetic field, based on scanning parameters of a pulse sequence to be used for a scan of the subject; and controlling a chiller that cools the gradient coil, based on the acquired power duty.

DETAILED DESCRIPTION OF THE INVENTION

Exemplary embodiments of a magnetic resonance imaging apparatus and a gradient coil cooling control method according to the present invention will be explained below in detail with reference to the accompanying drawings. Although the embodiments described below are explained in a case of using water as a coolant to be circulated in a cooling pipe (hereinafter, "cooling water"), the embodiments are not limited this, and can be similarly applied to a case of using another kind of coolant.

Figure 1:
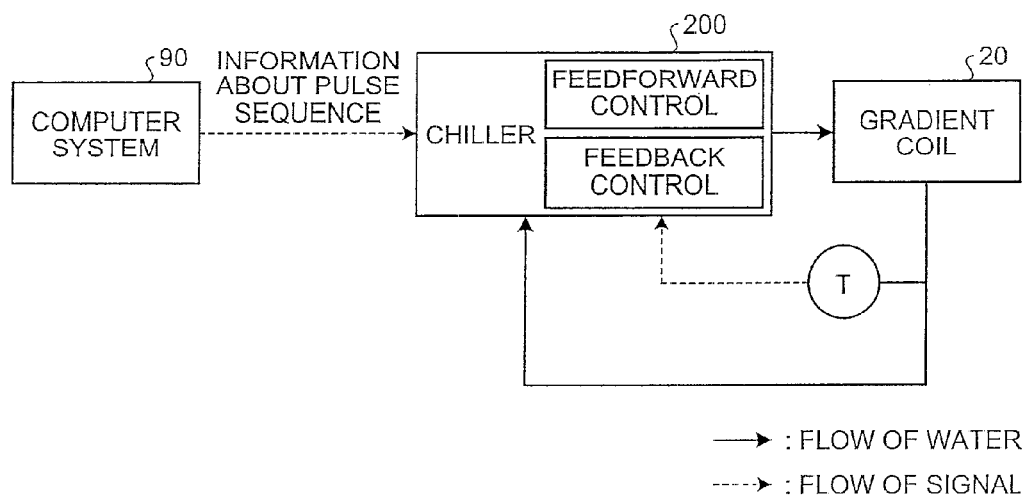
FIG. 1 is a schematic diagram for explaining a control method of a chiller according to a first embodiment of the present invention.

First of all, a control method of a chiller according to a first embodiment of the present invention is explained below. FIG. 1 is a schematic diagram for explaining a control method of the chiller according to the first embodiment. As shown in the figure, a chiller 200 performs feedforward control in addition to feedback control. The feedforward control means control to be performed in accordance with a predetermined control plan without feedback loop. According to the feedforward control, a cooling operation of the chiller is started before execution of a pulse sequence.

The gradient coil 20 generates heat with a current pulse that is applied in accordance with a pulse sequence. Therefore, if information about the pulse sequence is available, a calorific value of the gradient coil 20 can be predicted before a scan by specifying information about a current pulse required for generating a gradient magnetic-field pulse, and up to how high the temperature of the gradient coil 20 increases can be predicted.

For this reason, according to the first embodiment, information about a pulse sequence is acquired from a computer system 90, and then the maximum value of the temperature of the gradient coil 20 is predicted based on information about the pulse sequence and a temperature T of the gradient coil 20 at present. If the maximum value is equal to or higher than the upper limit, control for decreasing the gradient coil temperature T is started.

In this way, according to the first embodiment, by controlling the chiller by feedforward control based on the information about a pulse sequence and the temperature T of the gradient coil 20 at present, an increase in the range of variations in the gradient coil temperature T due to a delay in control by feedback control can be reduced.

A pulse sequence is created from scanning conditions including scanning parameters, such as Echo Time (TE) and Repetition Time (TR), and the type of an imaging method, and the scanning conditions are set when planning a scan. A gradient coil can be an Actively Shielded Gradient Coil (ASGC), or a Non-Shield Gradient Coil (NSGC). The ASGC includes a main coil that generates a gradient magnetic field, and a shield coil connected to the main coil in serial, and suppresses generation of an eddy current by cancelling a magnetic field leaking to the outside of the main coil by supplying currents that are inverse to each other to the respective coils. The NSGC does not include shield coil. Therefore, information about current pulses in a case of an ASGC is information about respective currents to run through the both of the main coil and the shield coil (i.e., respective currents for generating a gradient magnetic-field pulse and a gradient magnetic-field cancelling pulse); while information in a case of an NSGC is information only about a current to run through the main coil (i.e., a current for generating a gradient magnetic-field pulse).

Moreover, the chiller can acquire information about a current pulse required for generation of a gradient magnetic-field pulse or scanning conditions from the computer system 90, instead of information about a pulse sequence.

Figure 2:
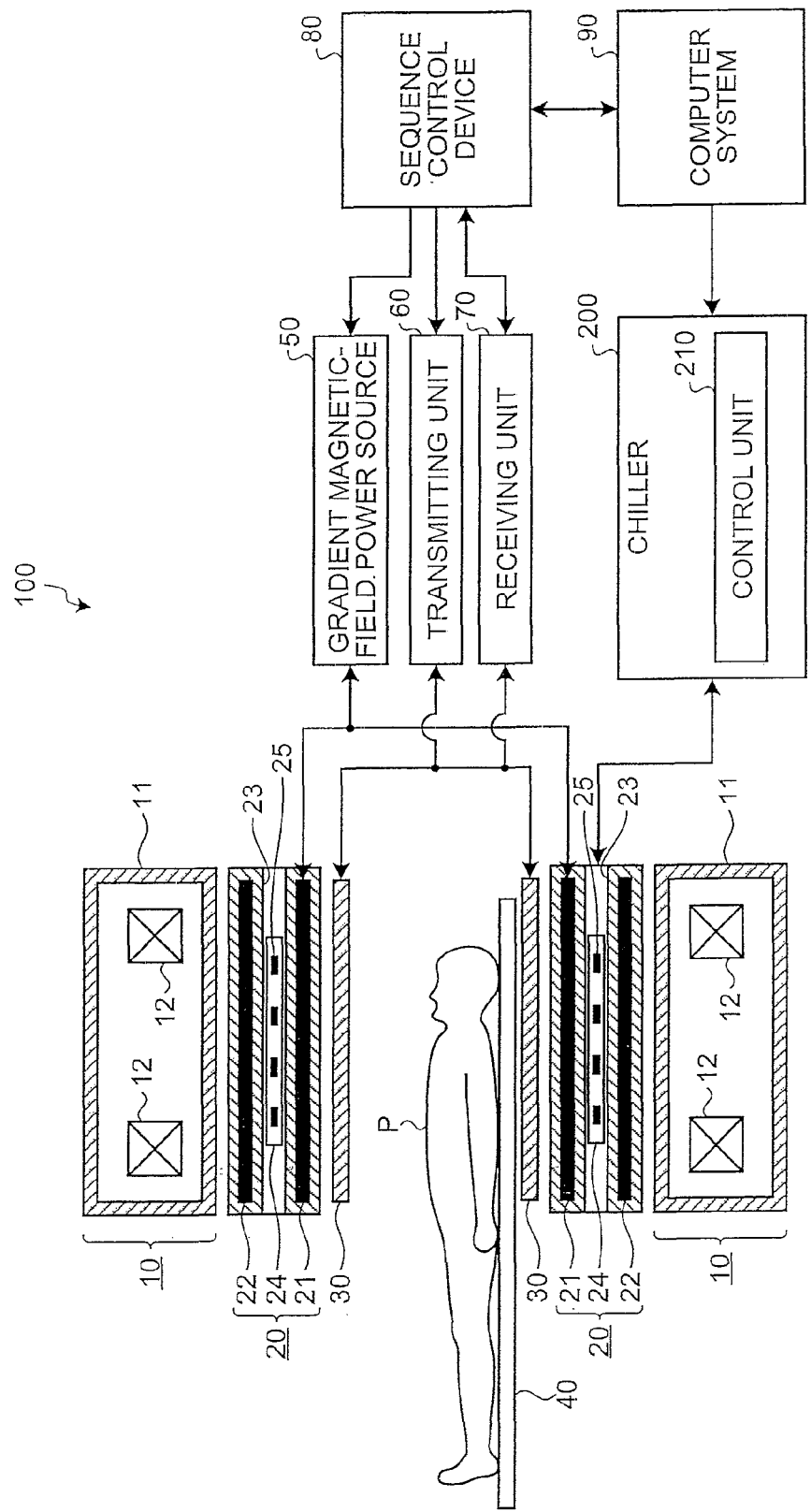
FIG. 2 is a functional block diagram of a Magnetic Resonance Imaging (MRI) apparatus according to the first embodiment.

A configuration of an MRI apparatus 100 according to the first embodiment is explained below. FIG. 2 is a functional block diagram of a configuration of the MRI apparatus 100 according to the first embodiment. As shown in the figure, the MRI apparatus 100 includes a static magnetic-field magnet 10, the gradient coil 20, a Radio Frequency (RF) coil 30, a table 40, a gradient magnetic-field power source 50, a transmitting unit 60, a receiving unit 70, a sequence control device 80, the computer system 90, and the chiller 200.

The static magnetic-field magnet 10 includes a vacuum container 11 that is substantially in a drum shape, and superconducting coils 12 that is immersed in a cooling liquid in the vacuum container 11; and generates a static magnetic field inside a bore (a space inside the drum of the static magnetic-field magnet 10), which is a scan region.

The gradient coil 20 is substantially in a drum shape, and anchored inside the static magnetic-field magnet 10. The gradient coil 20 includes a main coil 21 that applies a gradient magnetic field in directions of an x-axis, a y-axis, and a z-axis with a current supplied from the gradient magnetic-field power source 50, and a shield coil 22 that cancels a magnetic field leaked from the main coil 21.

A shim-tray insertion guide 23 is formed between the main coil 21 and the shield coil 22. A shim tray 24 that accommodates iron shims 25 for correcting ununiformity of a magnetic field inside the bore is to be inserted into the shim-tray insertion guide 23. A structure of the gradient coil 20 will be explained later in detail.

The RF coil 30 is anchored inside the gradient coil 20 on opposite sides of a subject P. The RF coil 30 radiates an RF pulse transmitted from the transmitting unit 60 to the subject P, and receives a magnetic resonance signal emitted by excitation of hydrogen nuclei from the subject P.

The table 40 is provided on a not-shown bed in a movable manner in the horizontal direction; and when performing a scan, the subject P is to be placed on the table 40, and then the table 40 is to be moved into the bore. The gradient magnetic-field power source 50 is a power source that supplies power to the gradient coil 20 based on an instruction from the sequence control device 80.

The transmitting unit 60 is a device that transmits an RF pulse to the RF coil 30 based on an instruction from the sequence control device 80. The receiving unit 70 detects a magnetic resonance signal received by the RF coil 30, and transmits raw data obtained by digitizing the detected magnetic resonance signal to the sequence control device 80.

The sequence control device 80 is a device that performs a scan of the subject P by activating the gradient magnetic-field power source 50, the transmitting unit 60, and the receiving unit 70, under the control of the computer system 90. As a result of performing a scan, when raw data is transmitted from the receiving unit 70, the sequence control device 80 transmits the raw data to the computer system 90.

The computer system 90 is a device that controls the whole of the MRI apparatus 100, and includes an input unit that receives various input from an operator; a sequence control unit that causes the sequence control device 80 to execute a scan based on scanning conditions input by the operator; an image reconstructing unit that reconstructs an image based on raw data transmitted from the sequence control device 80; a storage unit that stores, for example a reconstructed image; a display unit that displays various information, such as a reconstructed image; a main control unit that controls operation of each functional unit based on an instruction from the operator, and the like.

The chiller 200 cools the gradient coil 20 by circulating water through a cooling pipe provided to the gradient coil 20. The chiller 200 includes a control unit 210 that controls the chiller 200. Details of the control unit 210 will be explained later.

Figure 3:
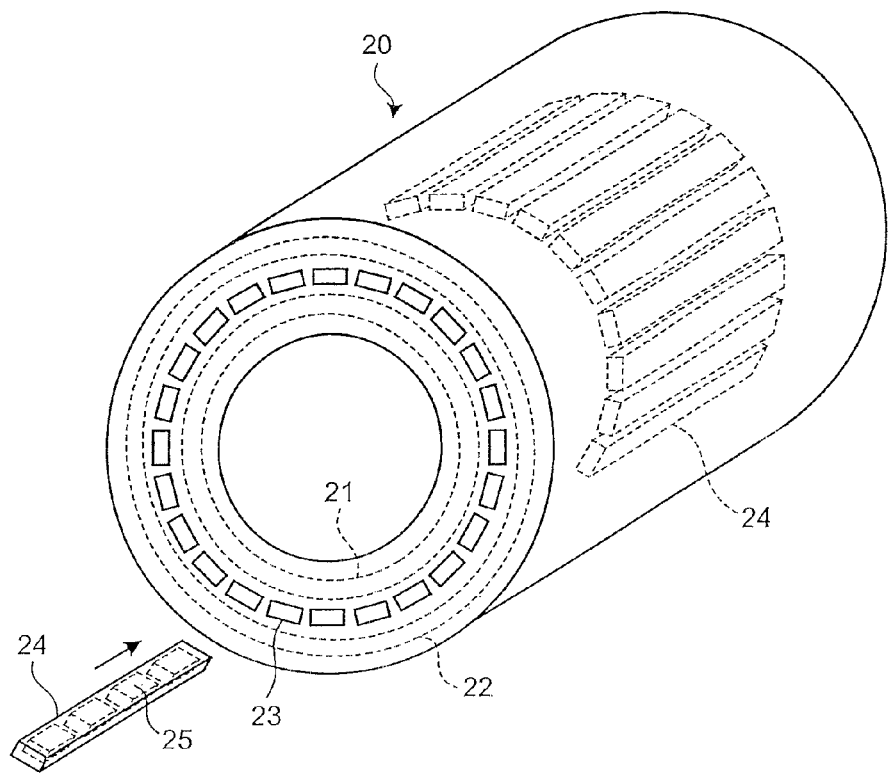
FIG. 3 is a perspective view of a structure of a gradient coil shown in FIG. 2.

A structure of the gradient coil 20 shown in FIG. 2 is explained below in detail. FIG. 3 is a perspective view of a structure of the gradient coil 20. As shown in the figure, the gradient coil 20 includes the main coil 21 that is substantially in a drum shape, and the shield coil 22. The shim-tray insertion guides 23 are formed between the two coils.

Each of the shim-tray insertion guides 23 is a through hole that has openings at both ends of the gradient coil 20, and is formed along the whole length in the longitudinal direction of the gradient coil 20. The shim-tray insertion guides 23 are formed so as to be in parallel with each other with regular intervals in the circumferential direction in a region between the main coil 21 and the shield coil 22. The shim tray 24 is inserted in each of the shim-tray insertion guides 23.

Each of the shim trays 24 is manufactured from a resin that is a non-magnetic and nonconductive material, and formed substantially in a stick shape. Each of the shim trays 24 accommodates a certain number of the iron shims 25. Each of the shim trays 24 is inserted into each of the shim-tray insertion guides 23, and anchored in the central part of the gradient coil 20.

Figure 4:
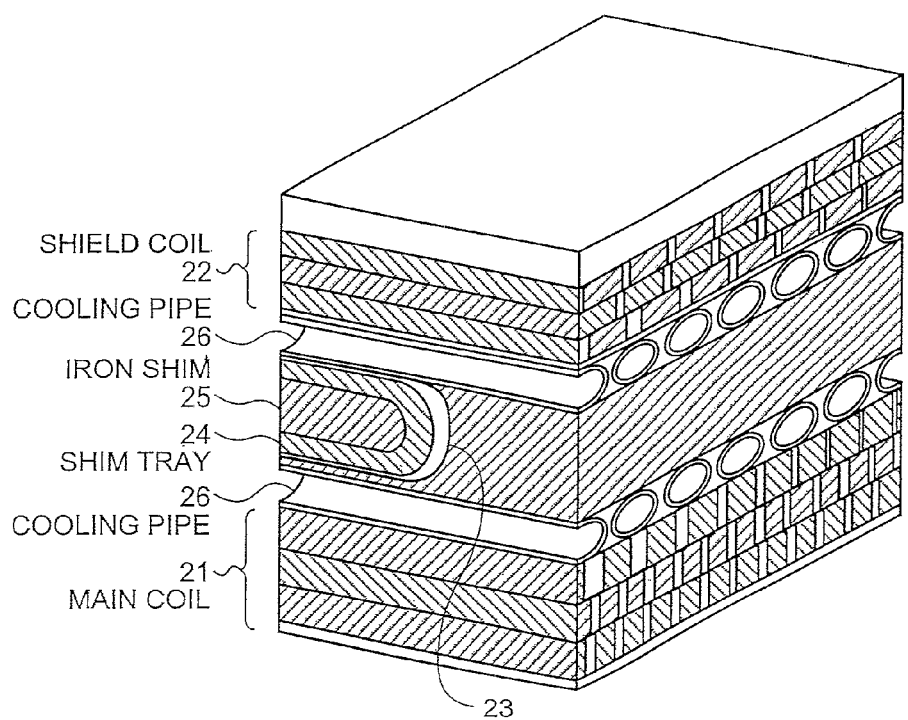
FIG. 4 is a structural diagram of an internal structure of the gradient coil.

Moreover, a cooling pipe is embedded in the gradient coil 20 spirally along the drum shape, although it is not shown in FIG. 3. FIG. 4 is a structure diagram that depicts an internal structure of the gradient coil 20. The figure depicts part of the gradient coil 20, the upper side of the figure depicts the outer side of the drum shape, and the lower side depicts the inner side of the drum shape.

As shown in the figure, a cooling pipe 26 is spirally embedded in the gradient coil 20 inside and outside the shim-tray insertion guides 23, namely, between the shim-tray insertion guides 23 and the main coil 21, and between the shim-tray insertion guides 23 and the shield coil 22. Cooling water sent from the chiller 200 flows into the cooling pipe 26, and the flowing-in cooling water circulates inside the gradient coil 20 through the cooling pipe 26, and then flows out to the outside of the gradient coil 20. In this way, the gradient coil 20 is cooled by circulating cooling water inside the gradient coil 20 through the cooling pipe 26.

Figure 5:
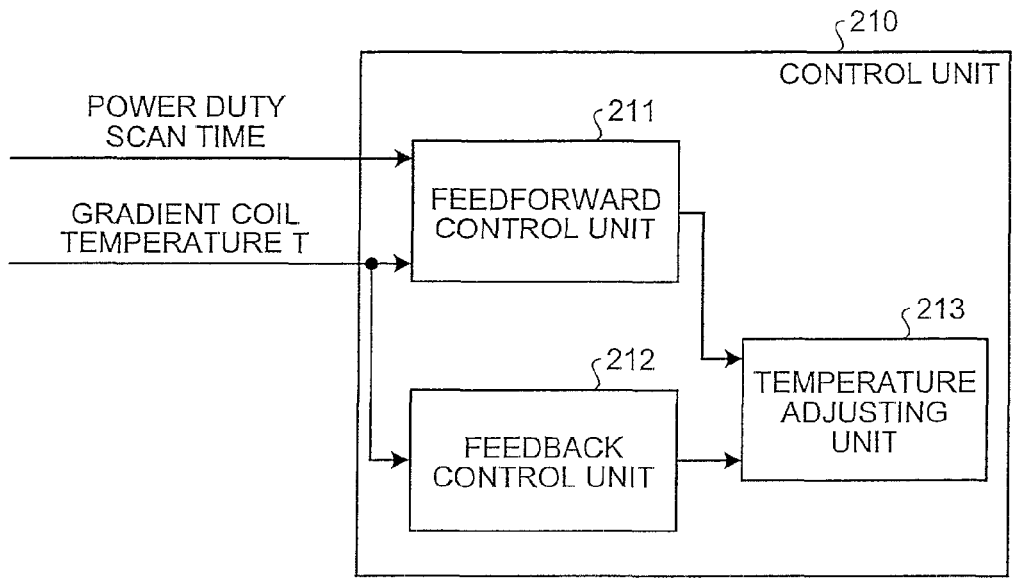
FIG. 5 is a functional block diagram of a control unit shown in FIG. 2.

Details of the control unit 210 shown in FIG. 2 is explained below. FIG. 5 is a functional block diagram of the control unit 210. As shown in the figure, the control unit 210 includes a feedforward control unit 211, a feedback control unit 212, and a temperature adjusting unit 213.

The feedforward control unit 211 acquires a power duty and a scan time of a pulse sequence from the computer system 90, and controls the chiller 200 by feedforward control. The power duty is a square of an average current value to be supplied to the gradient coil 20 according to the pulse sequence, and is expressed in percentage as 100% is the maximum.

A calorific value to be generated on the gradient coil 20 according to the pulse sequence can be predicted from a power duty and a scan time. The feedforward control unit 211 predicts a calorific value to be generated on the gradient coil 20 from the power duty and the scan time, and predicts the maximum value of the temperature of the gradient coil 20 from the predicted calorific value and the present temperature of the gradient coil 20. When it is predicted that the maximum value of the temperature of the gradient coil 20 exceeds a predetermined upper limit, the feedforward control unit 211 controls so as to circulate water to the gradient coil 20 at the start of a prescan or a predetermined time before the start of a prescan.

Although it is assumed that the feedforward control unit 211 performs control as feedforward control so as to circulate water to the gradient coil 20 at the start of a prescan, it can be configured so as to circulate water to the gradient coil 20 at a predetermined time before the start of a prescan. Moreover, it can be configured to perform feedforward control so as to decrease the temperature of the gradient coil 20 based on a difference between the predicted maximum value of the temperature of the gradient coil 20 and the predetermined upper limit.

Alternatively, it can be configured such that a control plan of the chiller 200 is created based on information about the pulse sequence and the present temperature of the gradient coil 20, and then the chiller 200 is controlled by feedforward control based on the control plan.

The feedback control unit 212 detects the temperature of the gradient coil 20 by using a temperature sensor, and determines an amount of changing the temperature of cooling water to be flowed into the cooling pipe of the gradient coil 20 in accordance with a detected variation in the temperature.

The temperature adjusting unit 213 is a device that changes the temperature of cooling water to be flowed into the cooling pipe of the gradient coil 20 based on the amount of changing the temperature determined by the feedback control unit 212, and can be implemented by using, for example, a heat exchanger.

Specifically, when being notified of an amount of changing the temperature $T_{in}$ by the feedback control unit 212, the temperature adjusting unit 213 changes the temperature of cooling water so as to change the temperature by the amount of changing $T_{in}$ per unit of time. The temperature adjusting unit 213 then flows the cooling water of which temperature is changed into the cooling pipe of the gradient coil 20.

Moreover, the temperature adjusting unit 213 receives instructions of the start of water circulation and the stop of water circulation from the feedforward control unit 211 and the feedback control unit 212, and then starts and stops water circulation to the chiller 200.

Figure 6:
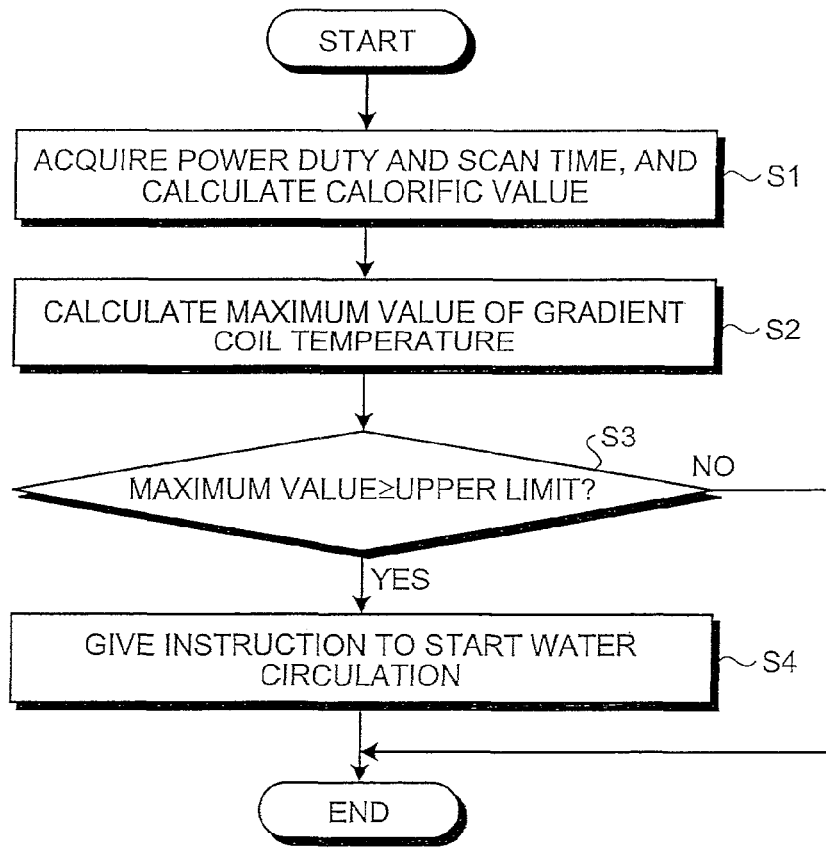
FIG. 6 is a flowchart of a process procedure of a feedforward control unit shown in FIG. 5.

A process procedure of the feedforward control unit 211 is explained below. FIG. 6 is a flowchart of a process procedure of the feedforward control unit 211. As shown in the figure, the feedforward control unit 211 acquires a power duty and a scan time of a pulse sequence from the computer system 90, and calculates a calorific value of the gradient coil 20 (Step S1).

The feedforward control unit 211 then predicts a maximum value of the temperature of the gradient coil 20 based on the present temperature of the gradient coil 20 (Step S2), and determines whether the maximum value exceeds the predetermined upper limit (Step S3). As a result, if the predicted maximum value exceeds the predetermined upper limit, the feedforward control unit 211 instructs the temperature adjusting unit 213 to start water circulation at the start of a prescan (Step S4).

As described above, according to the first embodiment, the feedforward control unit 211 predicts the maximum value of the temperature of the gradient coil 20 based on a power duty and a scan time of the pulse sequence, and the present temperature of the gradient coil 20. When the maximum value exceeds the predetermined upper limit, the feedforward control unit 211 controls so as to start a water circulation in the chiller 200 at the start of a prescan. Accordingly, overheating of the gradient coil 20 due to a delay in feedback control can be avoided, and fluctuations in the center frequency (f0) can be reduced.

The first embodiment is explained above in a case of controlling the chiller based on the temperature of the gradient coil 20 not to fluctuate the center frequency (f0). However, the chiller can be controlled directly based on the center frequency (f0). A second embodiment of the present invention is explained below in a case of controlling the chiller based on the center frequency (f0).

Figure 7:
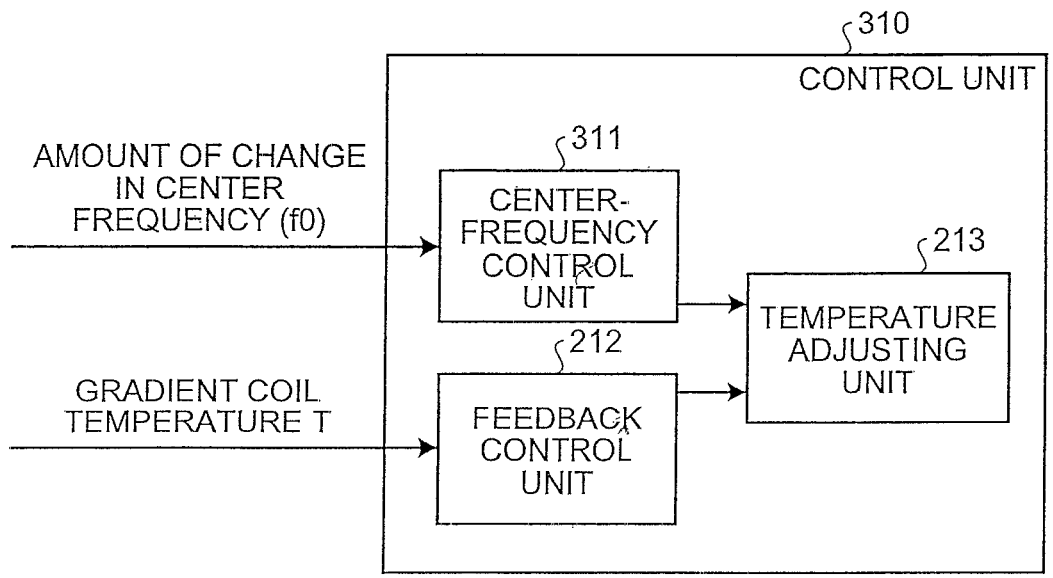
FIG. 7 is a functional block diagram of a control unit of a chiller according to a second embodiment of the present invention.
Figure 8:
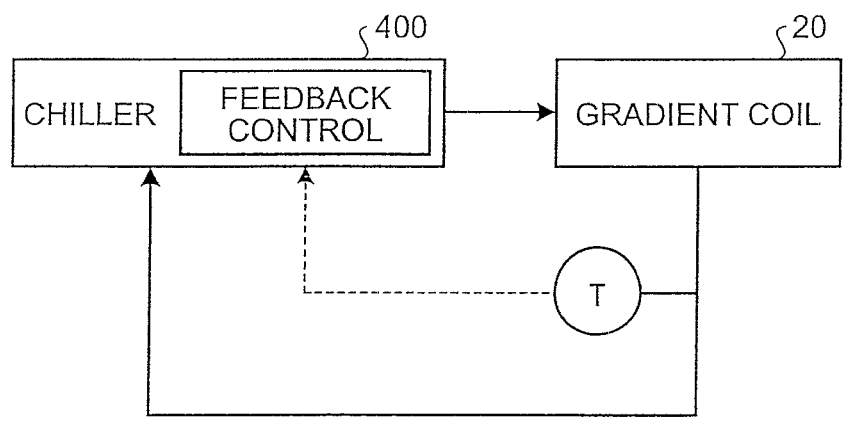
FIG. 8 is a schematic diagram that depicts a conventional method of cooling a gradient coil.

FIG. 7 is a functional block diagram of a control unit of a chiller according to the second embodiment. For convenience of explanation, functional units that play roles similar to those of the units shown in FIG. 5 are assigned with the same reference numerals, and detailed explanations of them are omitted.

As shown in FIG. 7, a control unit 310 includes a center-frequency control unit 311 instead of the feedforward control unit 211 compared with the control unit 210 shown in FIG. 5. The center-frequency control unit 311 acquires the amount of change in the center frequency (f0) from the sequence control device 80, and controls the temperature of cooling water based on the amount of change in the center frequency (f0).

Specifically, relation between a temperature change in the cooling water temperature ($\Delta T$) and the amount of change in the center frequency ($\Delta f0$) is preliminarily obtained. Precisely, a constant ($\alpha$) according to $\Delta T = \alpha \times \Delta f0$ is obtained in advance. The center-frequency control unit 311 calculates the amount of changing the cooling water temperature ($-\alpha \times \Delta f0$) from the amount of change in the center frequency (f0), and instructs the temperature adjusting unit 213 to change the temperature of cooling water by the amount of changing.

In this way, the second embodiment is configured such that the center-frequency control unit 311 controls the temperature of cooling water based on the amount of change in the center frequency (f0), thereby controlling the center frequency (f0) more accurately.

Although the first and the second embodiments are explained above in a case where a control unit is provided in a chiller, the present invention is not limited to this, and can be applied to a case where a chiller and a control unit are separately provided.

According to the first embodiment, the gradient coil 20 is an ASGC including the main coil 21 that generates a gradient magnetic field and the shield coil 22 that cancels a magnetic field leaking to the outside of the main coil 21. The feedforward control unit 211 controls the chiller 200 based on a power duty of a current that is determined from scanning parameters of a pulse sequence to be used for a scan of a subject, and is to be supplied to the main coil 21 and the shield coil 22.

Generally, because according to an ASGC, a magnetic field generated by the main coil and a magnetic field generated by the shield coil cancel each other, a larger current is required in order to generate a gradient magnetic field strong enough for a scan, compared with an NSGC, which does not include shield coil. Furthermore, recently an ASGC of a large diameter is required so that a subject of a large physique can be scanned, correspondingly, a distance between the main coil and the shield coil tends to be narrow. If a distance between the main coil and the shield coil becomes narrow, the amount of a magnetic field to be canceled becomes large, as a result, a much larger current is required.

To satisfy such requirement, for example, after a pulse sequence to be used for a scan of a subject is set by the operator, the feedforward control unit 211 acquires setting values of scanning parameters of the set pulse sequence from the computer system 90. The feedforward control unit 211 then calculates a power duty of a current to be supplied to the main coil 21 and the shield coil 22 based on the setting values of the acquired parameters. Furthermore, the feedforward control unit 211 predicts a calorific value of the gradient coil 20 from the calculated power duty, and then controls the chiller 200 based on the predicted calorific value.

Usually, an MRI apparatus performs a scan by setting various imaging protocols, such as $T_1$ weighted imaging, $T_2$ weighted imaging, Magnetic Resonance Angiography (MRA), Diffusion Weighted Imaging (DWI), and Fluid Attenuated Inversion Recovery (FLAIR). However, even according to an imaging protocol of the same type, power duties of currents to be supplied to the gradient coil 20 vary depending on values of scanning parameters set by the operator. Consequently, even according to an imaging protocol of the same type, calorific values of the gradient coil 20 during a scan vary.

By contrast, the MRI apparatus 100 according to the first embodiment calculates a power duty from scanning parameters of a pulse sequence, and then controls the chiller 200 based on the calculated power duty. Accordingly, the MRI apparatus 100 according to the first embodiment can precisely predict a calorific value of the gradient coil 20 during a scan regardless of the type of an imaging protocol, thereby appropriately cooling the gradient coil 20.

Among imaging methods performed by an MRI apparatus, there is a method of performing a main scan for creating an image for diagnosis after performing a prescan for collecting data required for the main scan. For example, in a case of echo planar imaging, which is one of fast imaging methods, a plurality of echo signals for one image is collected during a main scan by continuously inversing a readout gradient magnetic field with respect to one time of nuclear magnetic excitation, meanwhile echo signals are collected during a prescan without applying a phase-encoding gradient magnetic field.

For example, when executing an imaging method according to which a prescan is performed prior to a main scan, such as the echo planar imaging, the feedforward control unit 211 controls the chiller 200 at the start of a prescan or a predetermined time before the start of a prescan. Accordingly, even when executing an imaging method including a prescan and a main scan, the gradient coil can be appropriately cooled through the whole of a scan.

Although the second embodiment is explained above in case of controlling the chiller based on a value of the center frequency (f0), there is another case where a plurality of pulse sequences are continuously executed in one time of examination as a scan performed by an MRI apparatus. In such case, the strength and the shape of a gradient magnetic field generated by a gradient coil usually vary depending on a type of a pulse sequence. For this reason, calorific values of the gradient coil vary depending on a type of the pulse sequence. Consequently, when a plurality of pulse sequences is continuously executed, the center frequency (f0) sometimes fluctuates each time when an individual pulse sequence is executed, in some cases.

Therefore, it can be configured such that, for example, the MRI apparatus 100 sets a plurality of pulse sequences to be used for a scan of a subject, acquires the amount of change in the center frequency (f0) before executing each of the set pulse sequences, and then controls the chiller 200 based on the acquired amount of change in the center frequency (f0).

In such case, for example, the computer system 90 sets the pulse sequence to be used for the scan of the subject based on scanning parameters input by the operator. The center-frequency control unit 311 acquires the amount of change in the center frequency (f0) before executing each of the pulse sequences set by the computer system 90. The center-frequency control unit 311 then controls the chiller 200 based on the acquired amount of change in the center frequency (f0) each time when acquiring the amount of change in the center frequency (f0). Accordingly, even when continuously executing a plurality of pulse sequences during one time of a scan, the gradient coil can be more appropriately cooled in accordance with fluctuations in the center frequency (f0).

In such case, for example, the sequence control device 80 performs a scan for detecting a center frequency before executing each pulse sequence. The center-frequency control unit 311 then detects the center frequency (f0) based on data collected through a scan for detecting a center frequency each time when the scan is performed, and calculates the amount of change in the center frequency (f0).

Moreover, for example, there is another case where the MRI apparatus 100 includes a frequency measuring instrument that can measure the center frequency (f0). In such case, the center-frequency control unit 311 acquires the center frequency (f0) measured by the frequency measuring instrument before the sequence control device 80 executes a pulse sequence.

As described above, the embodiments according to the present invention are useful for cooling a gradient coil of an MRI apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a gradient coil that applies a gradient magnetic field onto a subject placed in a static magnetic field;
a chiller that cools the gradient coil; and
a control unit that controls the chiller, wherein
the gradient coil includes
a main coil that generates the gradient magnetic field, and
a shield coil that cancels a magnetic field leaking to an outside of the main coil, and
the control unit controls the chiller based on a power duty of a current to be supplied to the main coil and the shield coil, the power duty being determined from scanning parameters of a pulse sequence to be used for a scan of the subject.

2. The apparatus according to claim 1, wherein the control unit controls the chiller at one of a start of a prescan to be performed prior to a main scan according to a predetermined imaging method, and a predetermined time before a start of the prescan.

3. The apparatus according to claim 2, wherein
the predetermined imaging method is echo planar imaging by which a plurality of echo signals for one image is collected by continuously inversing a readout gradient magnetic field with respect to one time of nuclear magnetic excitation, and
the echo signals are collected during the prescan without applying a phase-encoding gradient magnetic field.

4. The apparatus according to claim 1, wherein the control unit predicts a calorific value of the gradient coil based on the power duty, and controls the chiller based on the predicted calorific value.

5. The apparatus according to claim 2, wherein the control unit predicts a calorific value of the gradient coil based on the power duty, and controls the chiller based on the predicted calorific value.

6. The apparatus according to claim 3, wherein the control unit predicts a calorific value of the gradient coil based on the power duty, and controls the chiller based on the predicted calorific value.

7. The apparatus according to claim 1, wherein the control unit predicts a calorific value of the gradient coil based on the power duty and a scan time, and controls the chiller based on the predicted calorific value.

8. The apparatus according to claim 2, wherein the control unit predicts a calorific value of the gradient coil based on the power duty and a scan time, and controls the chiller based on the predicted calorific value.

9. The apparatus according to claim 3, wherein the control unit predicts a calorific value of the gradient coil based on the power duty and a scan time, and controls the chiller based on the predicted calorific value.

10. The apparatus according to claim 1, wherein the control unit predicts a maximum value of a temperature of the gradient coil during a scan, and controls the chiller when the predicted maximum value is equal to or higher than a predetermined upper limit.

11. The apparatus according to claim 2, wherein the control unit predicts a maximum value of a temperature of the gradient coil during a scan, and controls the chiller when the predicted maximum value is equal to or higher than a predetermined upper limit.

12. The apparatus according to claim 3, wherein the control unit predicts a maximum value of a temperature of the gradient coil during a scan, and controls the chiller when the predicted maximum value is equal to or higher than a predetermined upper limit.

13. The apparatus according to claim 4, wherein the control unit predicts a maximum value of a temperature of the gradient coil during a scan, and controls the chiller when the predicted maximum value is equal to or higher than a predetermined upper limit.

14. The apparatus according to claim 5, wherein the control unit predicts a maximum value of a temperature of the gradient coil during a scan, and controls the chiller when the predicted maximum value is equal to or higher than a predetermined upper limit.

15. The apparatus according to claim 6, wherein the control unit predicts a maximum value of a temperature of the gradient coil during a scan, and controls the chiller when the predicted maximum value is equal to or higher than a predetermined upper limit.

16. The apparatus according to claim 7, wherein the control unit predicts a maximum value of a temperature of the gradient coil during a scan, and controls the chiller when the predicted maximum value is equal to or higher than a predetermined upper limit.

17. The apparatus according to claim 8, wherein the control unit predicts a maximum value of a temperature of the gradient coil during a scan, and controls the chiller when the predicted maximum value is equal to or higher than a predetermined upper limit.

18. The gradient coil cooling control method comprising:
acquiring a power duty of a current to be supplied to a main coil and a shield coil included in a gradient coil that applies a gradient magnetic field onto a subject placed in a static magnetic field, based on scanning parameters of a pulse sequence to be used for a scan of the subject; and
controlling a chiller that cools the gradient coil, based on the acquired power duty.

19. A magnetic resonance imaging apparatus comprising:
a gradient coil that applies a gradient magnetic field onto a subject placed in a static magnetic field, the gradient coil including a main coil that generates the gradient magnetic field and a shield coil that cancels a magnetic field leaking to an outside of the main coil;
a chiller having a first cooling pipe portion for cooling the main coil and a second cooling pipe portion for cooling the shield coil; and
a control unit connected to the chiller for controlling the chiller based on a power duty of a current to be supplied to the main coil and the shield coil, the power duty determined from scanning parameters of a pulse sequence to be used for a scan of the subject.

20. The magnetic resonance imaging apparatus according to claim 19 wherein the gradient coil further including a iron shim located between the main coil and the shield coil.

21. The magnetic resonance imaging apparatus according to claim 20 wherein the first cooling pipe portion is located between the iron shim and the main coil while the second cooling pipe portion is located between the iron shim and the shield coil.

* * * * *